US008035543B2

(12) United States Patent
Shin et al.

(10) Patent No.: US 8,035,543 B2
(45) Date of Patent: Oct. 11, 2011

(54) ANALOG-TO-DIGITAL CONVERSION CIRCUIT

(75) Inventors: Eun Seok Shin, Hwasung-si (KR); Min Kyu Song, Seongnam-si (KR); Jun Ho Moon, Seoul (KR); Hee Won Kang, Incheon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/686,654

(22) Filed: Jan. 13, 2010

(65) Prior Publication Data

US 2010/0182185 A1 Jul. 22, 2010

(30) Foreign Application Priority Data

Jan. 19, 2009 (KR) ........................ 10-2009-0004245

(51) Int. Cl.
*H03M 1/36* (2006.01)
(52) U.S. Cl. ........................................ 341/159; 341/155
(58) Field of Classification Search .................. 341/159, 341/155, 156, 161
See application file for complete search history.

(56) References Cited

U.S. PATENT DOCUMENTS

| 6,072,416 A * | 6/2000 | Shima ........................... 341/159 |
| 6,404,373 B1 * | 6/2002 | Yu et al. ........................ 341/155 |
| 6,847,320 B1 | 1/2005 | Taft et al. |
| 6,891,494 B2 | 5/2005 | Choi |
| 7,236,115 B1 | 6/2007 | Menkus et al. |

FOREIGN PATENT DOCUMENTS

| JP | 2003-309468 | 10/2003 |
| JP | 2005-136696 | 5/2005 |
| JP | 2006-087064 | 3/2006 |

* cited by examiner

*Primary Examiner* — Brian Young
(74) *Attorney, Agent, or Firm* — F. Chau & Associates, LLC

(57) ABSTRACT

An analog-to-digital conversion circuit includes a plurality of comparators and an averaging circuit. The averaging circuit is configured so that a length of a metal routing connected between output terminals of two comparators arranged on a leftmost side from among the plurality of comparators or a length of a metal routing connected between output terminals of two comparators arranged on a rightmost side from among the plurality of comparators is less than a length of a metal routing connected between output terminals of two comparators to which reference voltages having levels that are closest in magnitude are input.

17 Claims, 5 Drawing Sheets

ANALOG-TO-DIGITAL CONVERSION CIRCUIT

CROSS-REFERENCE TO RELATED APPLICATIONS

This application priority under 35 U.S.C. §119 to Korean Patent Application No. 10-2009-0004245, filed on Jan. 19, 2009, in the Korean Intellectual Property Office, which is incorporated by reference in its entirety herein.

BACKGROUND

1. Technical Field

Embodiments of the inventive concept relate to a data conversion circuit, and more particularly, to an analog-to-digital conversion circuit.

2. Discussion of Related Art

An analog-to-digital conversion circuit may include a plurality of analog blocks arranged in parallel with one another, which compare applied analog data voltages with reference voltages. However, the analog blocks may have a degraded linearity because of an offset error that may be generated during the manufacturing thereof.

An analog-to-digital conversion circuit may use an offset averaging technique to minimize performance degradation due to the offset error. In the technique, phase compensation is performed between adjacent analog blocks. When resistors are used in the technique, a reference voltage is included and a dummy block is inserted on both output ends of the analog blocks connected to each other in parallel, so that an averaging effect may be induced.

A Mobius band type averaging technique with a feedback loop may be used to satisfy low-power/small-area characteristics of an analog-to-digital conversion circuit. However, the Mobius band type averaging technique still degrades the linearity of the analog-to-digital conversion circuit because of a parasitic resistance component generated due to metal routing at both ends of the analog blocks.

SUMMARY

An analog-to-digital conversion circuit includes a comparator array and an averaging circuit according to an exemplary embodiment of the inventive concept. The comparator array includes a plurality of comparators for comparing a plurality of reference voltages with analog data, respectively, and for outputting logic signals based on results of the comparisons. The averaging circuit includes a plurality of metal routings for compensating for offsets generated in at least part of the logic signals output from the plurality of comparators. A length of a metal routing connected between an output terminal of a comparator to which a minimum reference voltage from among the plurality of reference voltages is input and an output terminal of a comparator to which a maximum reference voltage from among the plurality of reference voltages is input may be less than a length of a metal routing connected between output terminals of two comparators to which reference voltages that are closest magnitude from among the plurality of reference voltages are input, respectively. The comparator to which the minimum reference voltage from among the plurality of reference voltages is input and the comparator to which the maximum reference voltage from among the plurality of reference voltages is input may be arranged adjacent to either end of the comparator array.

The length of the metal routing connected between the output terminal of the comparator to which the minimum reference voltage from among the plurality of reference voltages is input and the output terminal of the comparator to which the maximum reference voltage from among the plurality of reference voltages is input may be half the length of the metal routing connected between the output terminals of the two comparators to which reference voltages that are closest in magnitude from among the plurality of reference voltages are input, respectively.

An analog-to-digital conversion circuit includes a reference voltage generation circuit, a comparator array, and an averaging circuit according to an exemplary embodiment of the inventive concept. The reference voltage generation circuit outputs a plurality of reference voltages. The comparator array includes a plurality of comparators for comparing the plurality of reference voltages with analog data, respectively, and for outputting logic signals based on results of the comparisons. The comparators to which low reference voltages from among the plurality of reference voltages are input alternate with comparators to which high reference voltages from among the plurality of reference voltages are input. The averaging circuit includes at least one metal routing connected between output terminals of odd ordered comparators from among the plurality of comparators and at least one metal routing connected between output terminals of even ordered comparators from among the plurality of comparators.

The averaging circuit may further include a first metal routing connected between output terminals of a first pair of comparators arranged on one end of the comparator array and a second pair of comparators arranged on the other end of the comparator array. A length of the first and second metal routings connected between the output terminal may be less than a length of the at least one metal routing connected between the output terminals of the odd ordered comparators from among the plurality of comparators and a length of the at least one metal routing connected between the output terminals of the even ordered comparators from among the plurality of comparators.

The length of the first and second metal routings may be half a length of the at least one metal routing connected between the output terminals of the odd ordered comparators from among the plurality of comparators and a length of the at least one metal routing connected between the output terminals of the even ordered comparators from among the plurality of comparators. The plurality of comparators may compare the plurality of reference voltages with a positive analog voltage of a pair of differential analog data voltages of the analog data and a negative analog voltage of the pair, respectively, and the output logic signals may then include positive and negative logic signals.

An analog-to-digital conversion circuit includes a plurality of comparators and an average circuit according to an exemplary embodiment of the inventive concept. The averaging circuit is configured so that a length of a metal routing connected between output terminals of two comparators arranged on a leftmost side from among the plurality of comparators or a length of a metal routing connected between output terminals of two comparators arranged on a rightmost side from among the plurality of comparators is less than a length of a metal routing connected between output terminals of two comparators to which reference voltages that are closest in magnitude are input.

The analog-to-digital conversion circuit may have a flash type structure, a pipeline type structure, a folding type structure, or an interpolation type structure. Each comparator may have first-third input terminals and first-second output terminals, where each of the first input terminals receives a positive analog voltage, where each of the second input terminals receives a negative analog voltage, and where adjacent pairs of the third input terminals respectively receive high and low reference voltages. The low reference voltages are different from one another, the high reference voltages are different from one another, and the low reference voltages are lower than the high voltages. The first output terminals output a first differential voltage based on the input positive analog voltage and the input reference voltage, and the second output terminals output a second differential voltage based on the input negative analog voltage and the input reference voltage. One of the two comparators may receive the highest of high reference voltages and the other of the two comparators receives the lowest of the low reference voltages.

BRIEF DESCRIPTION OF THE DRAWINGS

Exemplary embodiments of the present invention will be more clearly understood from the following detailed description taken in conjunction with the accompanying drawings in which.

DETAILED DESCRIPTION OF EXEMPLARY EMBODIMENTS

Figure 1:
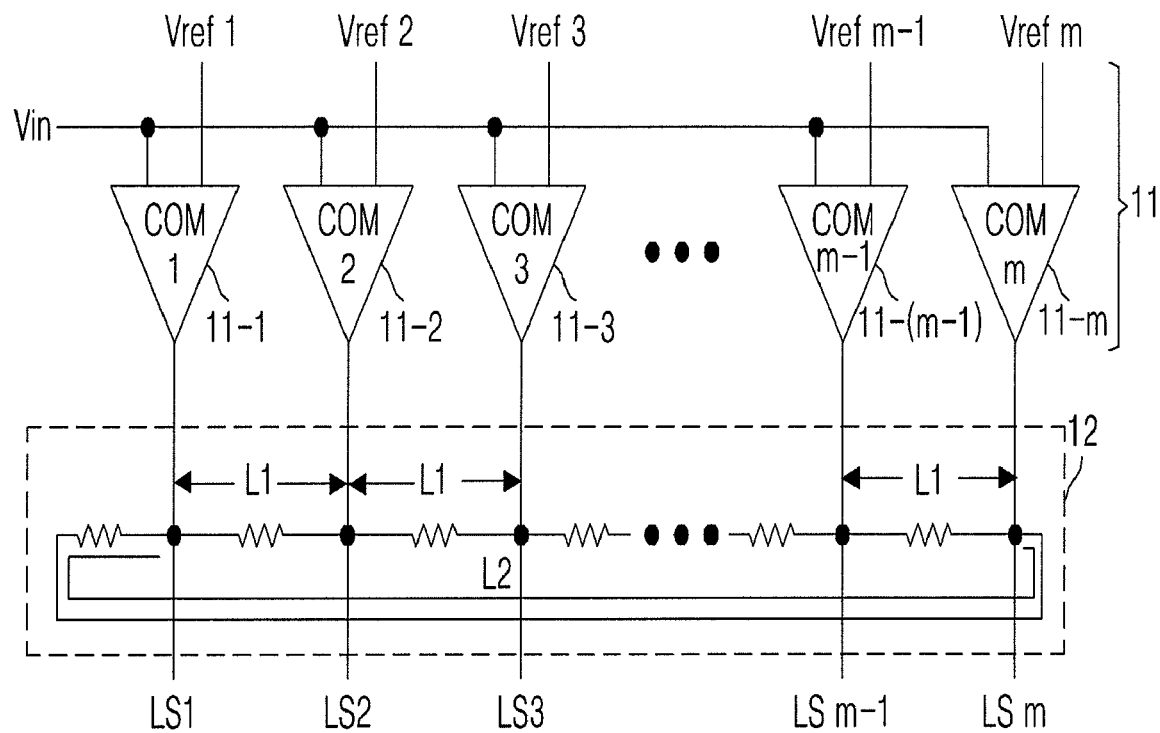
FIG. 1 is a schematic circuit diagram of a comparator array of an analog-to-digital conversion circuit.

FIG. 1 is a schematic circuit diagram of a comparator array 11 of an analog-to-digital conversion circuit. Referring to FIG. 1, the analog-to-digital conversion circuit includes a plurality of comparators 11-1 through to 11-$m$ which are included in comparator array 11, and an averaging circuit 12. The averaging circuit 12 compensates for an offset that may be generated by one of a plurality of logic signals LS1, LS2, through to LSm output by the comparators 11-1 through to 11-$m$, respectively.

When a resistor is inserted between respective output terminals of the comparators 11-1, 11-2, through to 11-$m$, metal routing lengths between adjacent resistors may be identical to one another to minimize a variation in an averaging resistor value caused due to a parasitic resistance component of metal. Although the resistance component of metal may vary, the resistance component is typically proportional to the length L of the resistor and inversely proportional to the width W of the resistor.

As illustrated in FIG. 1, a comparator 11-1 and a comparator 11-$m$ to which a minimum reference voltage (for example, Vref1) and a maximum reference voltage (for example, Vrefm) from among a plurality of reference voltages Vref1 through Vrefm are input, respectively, are arranged on both end portions of the comparator array 11, respectively. The remaining comparators 11-2 through 11-($m$-1) are sequentially arranged between the comparator 11-1 and the comparator 11-$m$.

However, if the comparator array 11 is configured as illustrated in FIG. 1, a metal routing length L2 between an output terminal of the first comparator 11-1 and an output terminal of the m-th comparator 11-$m$ may be significantly longer than a metal routing length L1 between the output terminals of other adjacent comparators.

According to this configuration, the linearity of a final output of the analog-to-digital conversion circuit may be degraded. In particular, when high-speed analog data is processed, resistance-capacitance (R-C) delay caused due to the parasitic resistance component may lead to a reduction of a Signal to Noise and Distortion Ratio (SNDR) or Spurious Free Dynamic Range (SFDR) of the analog-to-digital conversion circuit.

Figure 2:
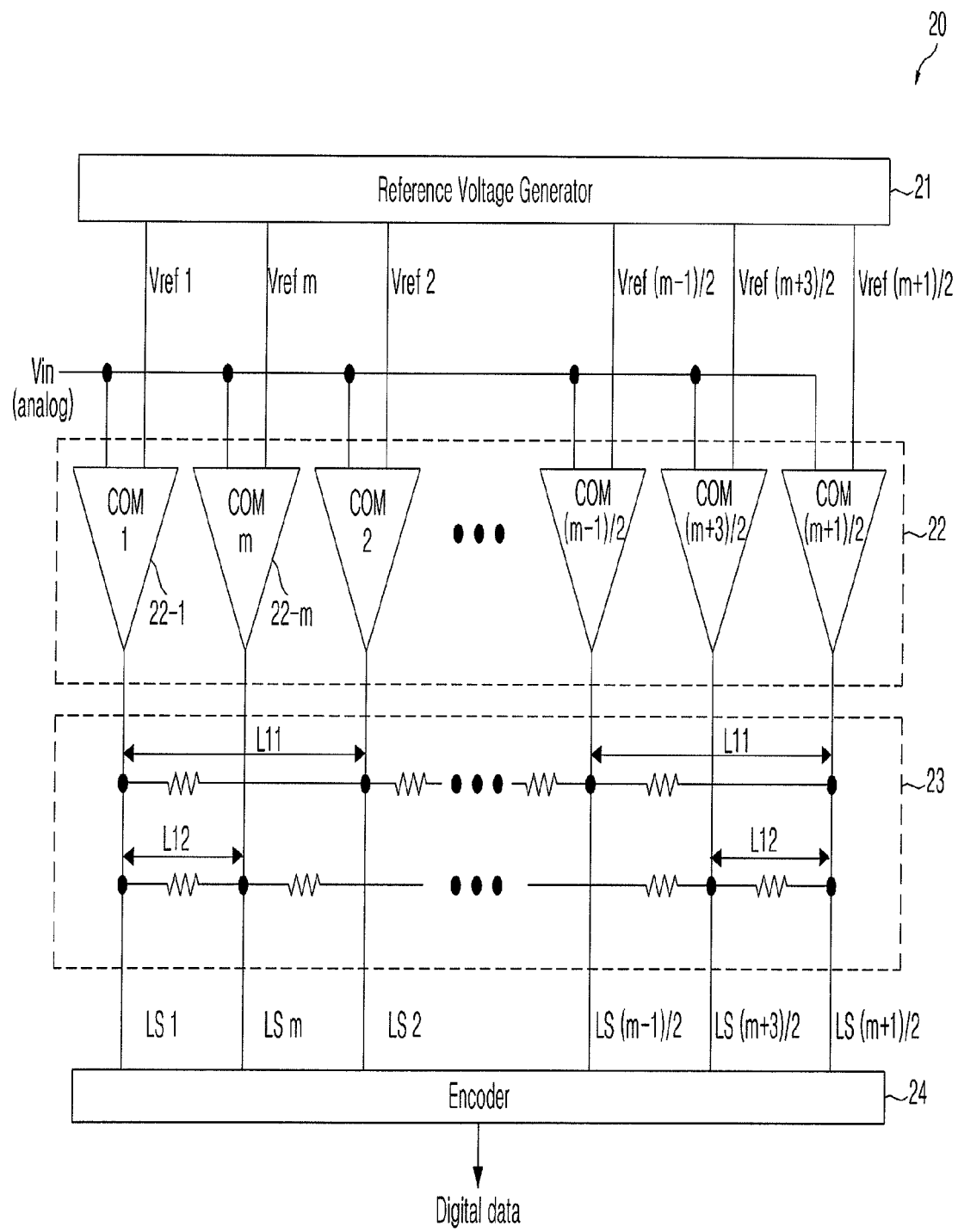
FIG. 2 is a schematic circuit diagram of an analog-to-digital conversion circuit according to an exemplary embodiment of the inventive concept.

FIG. 2 is a schematic circuit diagram of an analog-to-digital conversion circuit 20 according to an exemplary embodiment of the inventive concept. Referring to FIG. 2, the analog-to-digital conversion circuit 20 may include a reference voltage generator 21, a comparator array 22, an averaging circuit 23, and an encoder 24.

The reference voltage generator 21 may generate and output a plurality of reference voltages Vref1 through Vrefm. The reference voltage generator 21 may include a resistor string (not shown) for generating the plurality of reference voltages Vref1 through Vrefm. The resistor string may include a plurality of resistors serially connected between a first voltage (for example, a ground voltage) and a second voltage (for example, a power supply voltage) to generate the plurality of reference voltages Vref1 through Vrefm. The reference voltages Vref1 through Vrefm may be input to a plurality of comparators 22-1, 22-2, through to 22-$m$, respectively, which are included in the comparator array 22.

For example, if the analog-to-digital conversion circuit 20 outputs N-bit (where N denotes a positive integer) digital data, the resistor string included in the reference voltage generator 21 may include $2^N$ resistors connected between the first voltage (for example, the ground voltage) and the second voltage (for example, the power supply voltage). Accordingly, $(2^N-1)$ reference voltages having magnitudes between the magnitudes of the first voltage (for example, the ground voltage) and the second voltage (for example, the power supply voltage) may be generated and output to the comparators 22-1, 22-2, through to 22-$m$, respectively. The $(2^N-1)$ reference voltages may be different from one another. For example, each subsequent reference voltage may be twice or half the voltage of each current reference voltage.

In an alternate embodiment, if the first voltage (for example, the ground voltage) and the second voltage (for example, the power supply voltage) are used as reference voltages, $(2^N+1)$ reference voltages may be output from the reference voltage generator 21.

As described above, the comparator array 22 may include a plurality of comparators 22-1 through 22-$m$. The comparators 22-1 through 22-$m$ may compare the reference voltages Vref1 through Vrefm, respectively, output from the reference voltage generator 21 with analog input data voltage Vin, and output logic signals LS1 through LSm based on results of the comparisons, respectively.

For example, the first comparator 22-1 may compare the analog input data voltage Vin with the first reference voltage Vref1 and output the logic signal LS1 based on a result of the comparison. If the analog input data voltage Vin is less than the first reference voltage Vref1, the first comparator 22-1 may output a logic signal LS1 having a first level (for example, a low level). Alternately, if the analog input data Vin is greater than the first reference voltage Vref1, the first comparator 22-1 may output a logic signal LS1 having a second level (for example, a high level).

As illustrated in FIG. 2, the comparators 22-1 through 22-m included in the comparator array 22 are not arranged in the order of reference voltage magnitude but are arranged so that a comparator to which a low reference voltage is input alternate with a comparator to which a high reference voltage is input. A comparator (for example, the comparator 22-1) to which a lowest reference voltage (for example, Vref1) from among the reference voltages Vref1 through Vrefm is input may be arranged on either end of the comparator array 22. A comparator (for example, the comparator 22-m) to which a highest reference voltage (for example, Vrefm) from among the reference voltages Vref1 through Vrefm is input may be arranged adjacent to the comparator to which the lowest reference voltage from among the reference voltages Vref1 through Vrefm is input. Next, a comparator to which the second lowest reference voltage (for example, Vref2) is input may be arranged, and a comparator to which the second highest reference voltage is input is arranged next to the comparator to which the second lowest reference voltage is input.

For example, if 7 ($=2^3-1$) comparators (e.g., m=7) are used to output 3-bit digital data, the 7 comparators may be arranged in the order of a first comparator, a seventh comparator, a second comparator, a sixth comparator, a third comparator, a fifth comparator, and a fourth comparator.

In FIG. 2, the comparator array 22 includes the m comparators 22-1 through 22-m, and the comparators 22-1 through 22-m are arranged so that comparators to which low reference voltages are input and comparators to which high reference voltages are input alternate in this order. The number of comparators, m, may be associated with the number (for example, N) of bits of digital data which is to be output. For example, '$m=2^N-1$'.

The averaging circuit 23 may compensate for an offset that may be generated in the output of one of the comparators 22-1 through 22-m. As illustrated in FIG. 2, the averaging circuit 23 may include a plurality of resistors each connected between the output terminals of comparators to which two reference voltages having adjacent magnitudes are applied (e.g., see L11). As illustrated in FIG. 2, the averaging circuit 23 may further include a resistor connected between the output terminals of the first comparator 22-1 and the m-th comparator 22-m (e.g., see L12). Accordingly, a metal routing length L12 between the output terminals of the first comparator 22-1 and the m-th comparator 22-m is less than (e.g., about half) the other metal routing lengths L11, and thus a linearity error due to a parasitic resistance component may be reduced.

The encoder 24 may encode the logic signals LS1 through LSm output from the comparator array 22 to generate digital data. In an alternate embodiment, the encoder 24 may further perform an operation for thermometer coding the logic signals LS1 through LSm.

The averaging circuit 23 may include at least one metal routing connected between output terminals of odd ordered comparators from among the plurality of comparators and at least one metal routing connected between output terminals of even ordered comparators from among the plurality of comparators.

Figure 3:
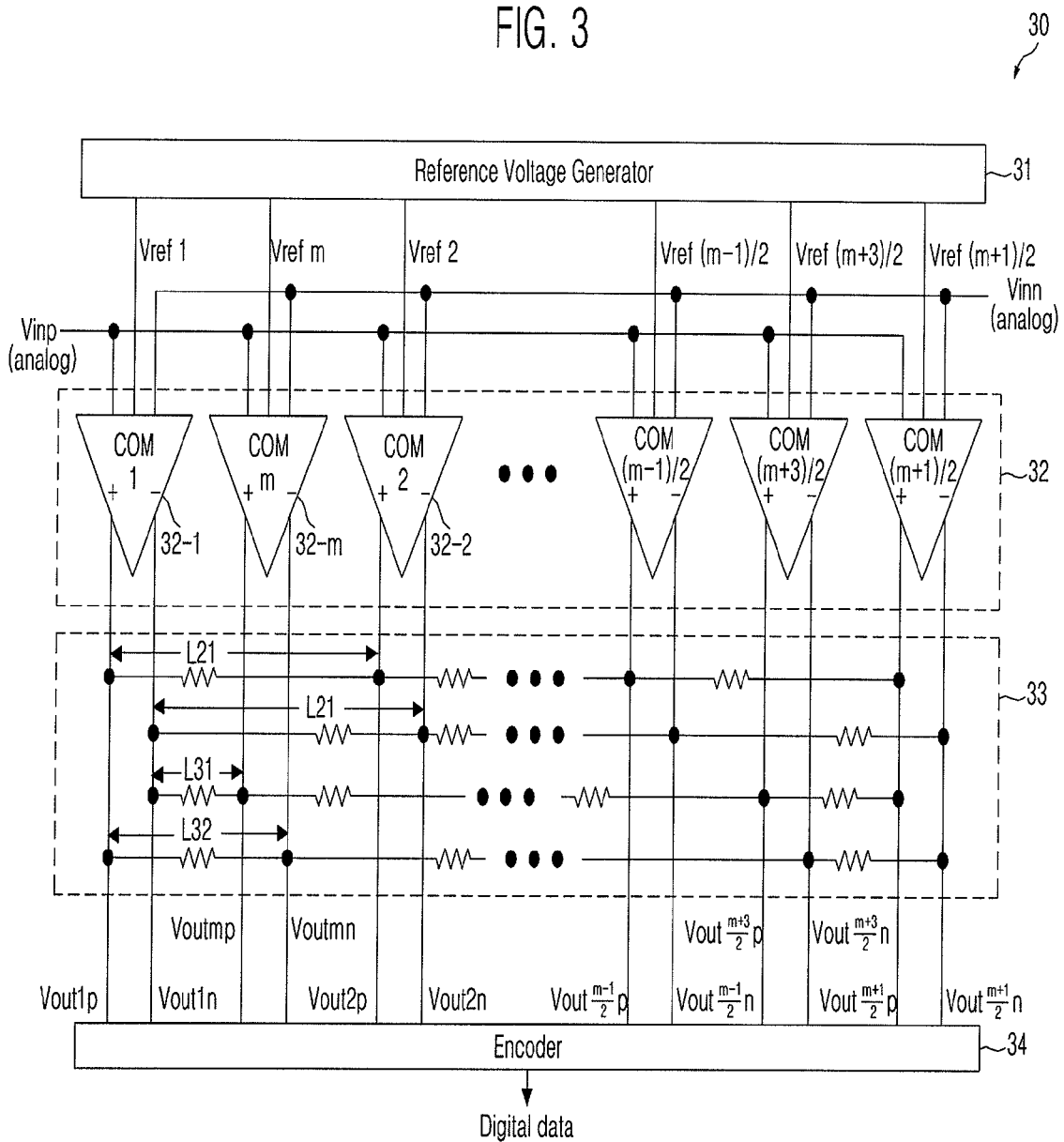
FIG. 3 is a schematic circuit diagram of an analog-to-digital conversion circuit according to an exemplary embodiment of the inventive concept.

FIG. 3 is a schematic circuit diagram of an analog-to-digital conversion circuit 30 according to an exemplary embodiment of the inventive concept. Referring to FIG. 3, the analog-to-digital conversion circuit 30 is substantially the same as the analog-to-digital conversion circuit 20 of FIG. 2, and is different therefrom in that differential analog input signals Vinp and Vinn input to each of a plurality of comparators 32-1 through 32-m cause differential output signals Voutip and Voutin (where $1 \leq i \leq m$, i denotes a positive integer) output from each of the comparators 32-1 through 32-m to form a differential pair. Therefore, an influence of temporal overshoot may be reduced.

The averaging circuit 33 may include a plurality of resistors each connected between the positive output terminals of comparators to which two reference voltage having adjacent magnitudes are applied (e.g., see first L21), and a plurality of resistors each connected between the negative output terminals of the comparators to which two reference voltage having adjacent magnitudes are applied (e.g., see second L21). The averaging circuit 33 may further include resistors connected between the output terminals of a comparator (for example, the comparator 32-1) to which a minimum reference voltage (for example, Vref1) from among a plurality of reference voltages Vref1 through Vrefm output from a reference voltage generator 31 is input and the output terminals of a comparator (for example, the comparator 32-m) to which a maximum reference voltage (for example, Vrefm) from among the reference voltages Vref1 through Vrefm is input (e.g., see L31 and L32).

For example, as illustrated in FIG. 3, a resistor may be connected between a positive output terminal of the first comparator 32-1 and a positive output terminal of the second comparator 32-2 (see e.g., first L21), and a resistor may be connected between a negative output terminal of the first comparator 32-1 and a negative output terminal of the second comparator 32-2 (see e.g., second L21). In addition, each comparator 32-i (where $1 \leq i \leq m$, i denotes a positive integer) outputs a positive output voltage Voutip (where $1 \leq i \leq m$, i denotes a positive integer) and a negative output voltage Voutin (where $1 \leq i \leq m$, i denotes a positive integer). However, in an alternate embodiment, each comparator 32-i may output a logic signal based on the positive output voltage Voutip (where $1 \leq i \leq m$, i denotes a positive integer) and a logic signal based on the negative output voltage Voutin (where $1 \leq i \leq m$, i denotes a positive number).

In an alternate embodiment, the encoder 34 may generate the logic signals based on the positive output voltage Voutip (where $1 \leq i \leq m$, i denotes a positive integer) and the negative output voltage Voutin (where $1 \leq i \leq m$, i denotes a positive integer) and output digital data of a predetermined number of bits based on the logic signals. Metal routing lengths L31 and L32 connected between the output terminals of the first comparator 32-1 and the output terminals of the m-th comparator 32-m of the analog-to-digital conversion circuit 30 are less than (e.g., about half) the other metal routing lengths L21, and thus a linearity error due to a parasitic resistance component may be reduced. The lengths of L31, L32 and L21 may not be drawn to scale in FIG. 3. For example, while length L31 appears smaller than length L32 in FIG. 3, lengths L31 and L32 may be the same or similar length. Further, while length L32 appears larger than half the length L21 in FIG. 3 and length L31 appears smaller than half the length L21 in FIG. 3, lengths L31 and L32 may be half or about half the length L21. The analog-to-digital conversion circuits of FIG. 2 and FIG. 3 may have a flash type structure, a pipeline type structure, a folding type structure, or an interpolation type structure, etc.

Figure 4:
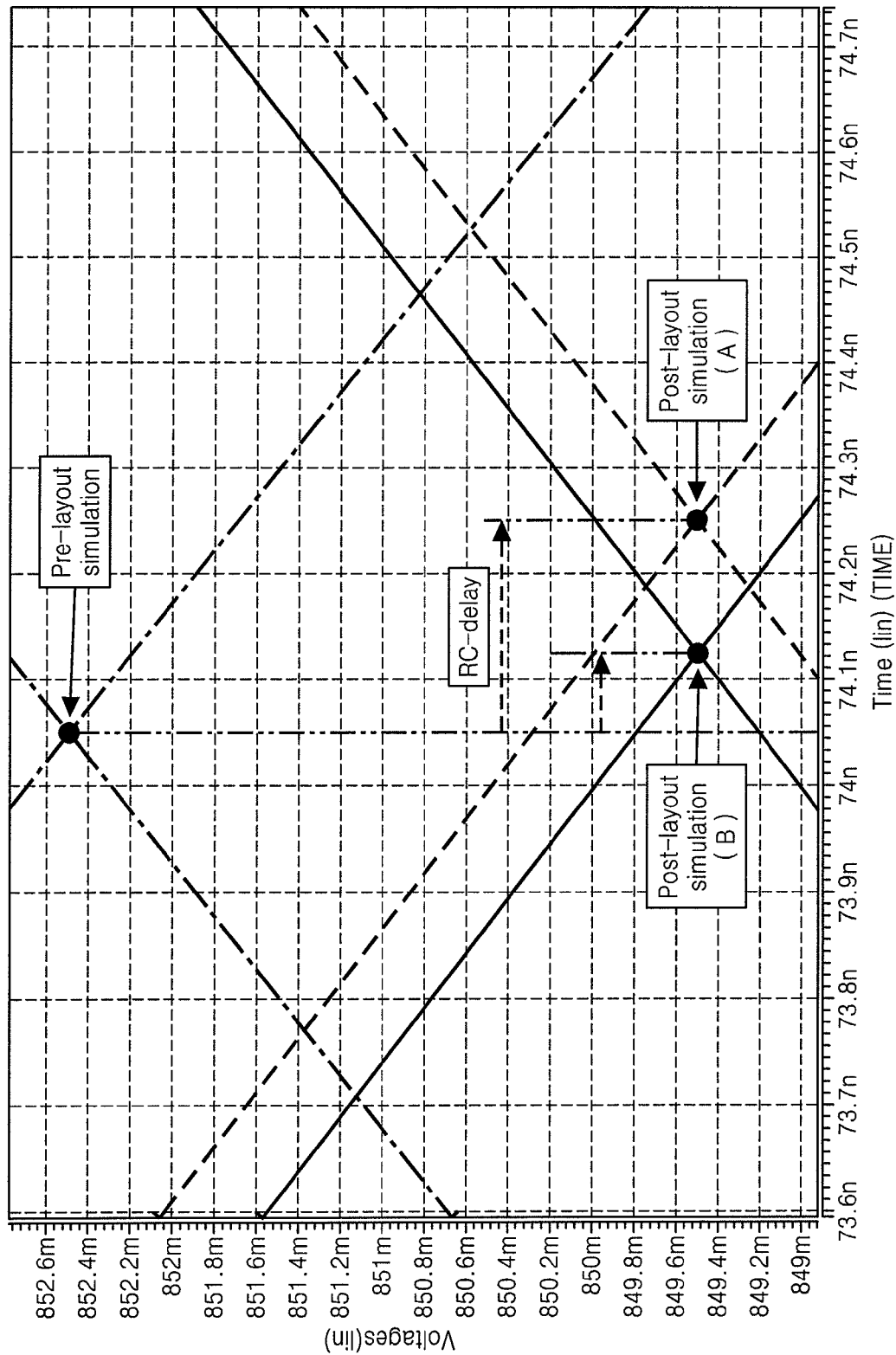
FIG. 4 is an graph showing a comparison between results of simulations performed on an analog-to-digital conversion circuit of FIG. 1 and analog-to-digital conversion circuits according to embodiments illustrated in FIGS. 2 and 3.

FIG. 4 is an exemplary graph showing a comparison between results A of simulations performed on an analog-to-digital conversion circuit of FIG. 1 and results B of an embodiment of the analog-to-digital conversion circuits 20 and 30 illustrated respectively in FIGS. 2 and 3. Referring to FIGS. 2 through 4, a pre-layout simulation of FIG. 4 shows results of simulations performed on the output signals of the comparator arrays 22 and 32, which are ideal because they do not include a parasitic resistance component generated due to metal routing, and a post-layout simulation shows a simulation result with respect to an output signal in which RC delay caused by metal routing is included.

As shown in FIG. 4, embodiments of the analog-to-digital conversion circuits 20 or 30 may reduce the influence of parasitic RC compared with the analog-to-digital conversion circuit of FIG. 1, thereby generating output signals close to the pre-layout simulation result.

Figure 5:
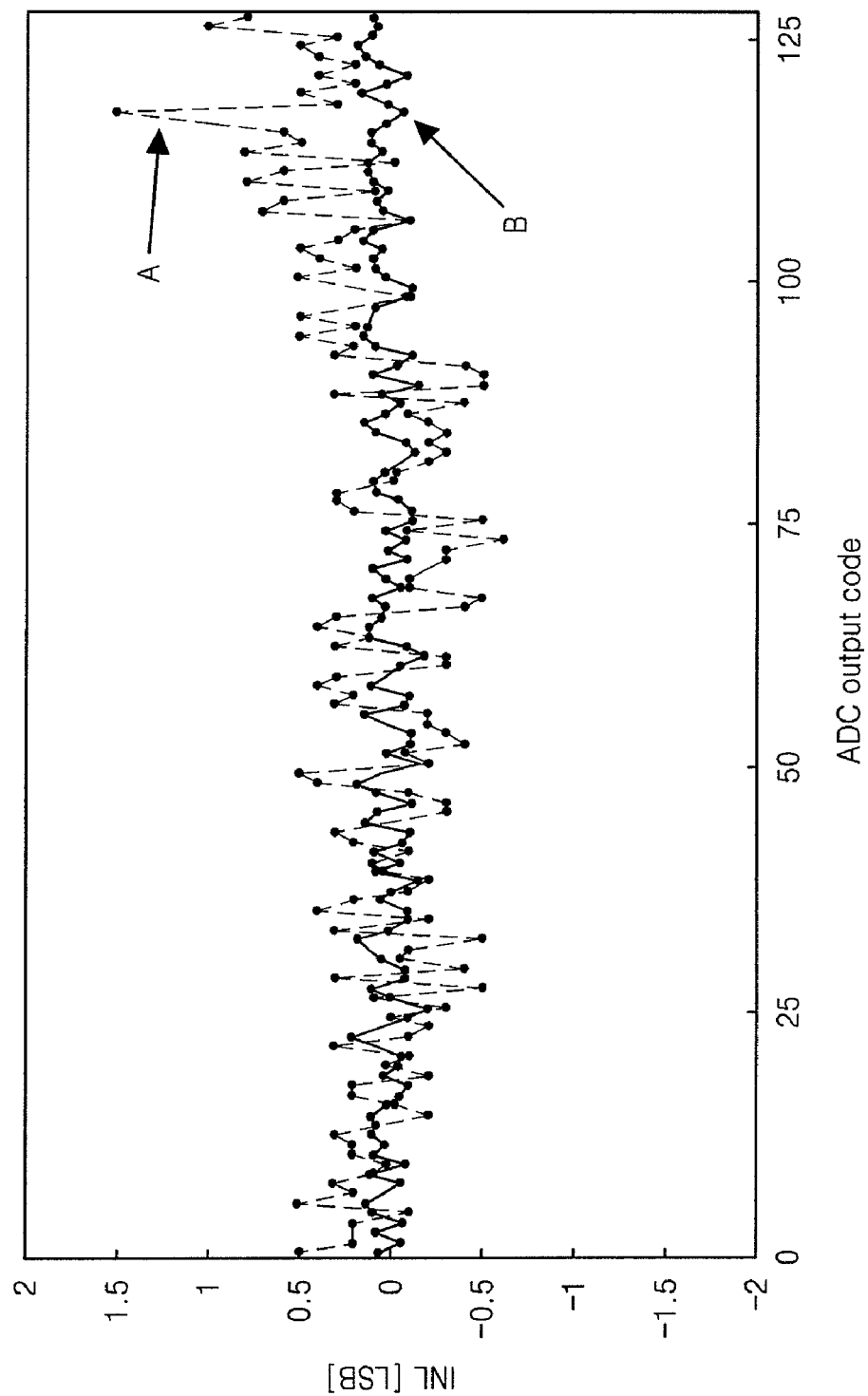
FIG. 5 is an exemplary graph showing a comparison between the linearity of an analog-to-digital conversion circuit of FIG. 1 and the linearity of an analog-to-digital conversion circuits according to embodiments illustrated in FIGS. 2 and 3.

FIG. 5 is an exemplary graph showing a comparison between the integral non-linearity A of the analog-to-digital conversion circuit of FIG. 1 and the integral non-linearity B of an embodiment of the analog-to-digital conversion circuits 20 and 30 illustrated respectively in FIGS. 2 and 3. Referring to FIGS. 2 through 5, the analog-to-digital conversion circuits 20 and 30 have improved linearity compared with the analog/digital conversion circuit of FIG. 1.

While the inventive concept has been particularly shown and described with reference to exemplary embodiments thereof, it will be understood that various changes in form and details may be made therein without departing from the spirit and scope of the disclosure.

What is claimed is:

1. An analog-to-digital conversion circuit comprising:
   a comparator array comprising a plurality of comparators for comparing a plurality of reference voltages with an analog signal, respectively, and for outputting logic signals based on results of the comparisons; and
   an averaging circuit comprising a plurality of metal routings for compensating an offset in at least one of the logic signals output from the plurality of comparators,
   wherein a length of a metal routing connected between an output terminal of a first comparator of the comparators to which a minimum reference voltage from among the plurality of reference voltages is input and an output terminal of a second comparator of the comparators to which a maximum reference voltage from among the plurality of reference voltages is input is less than a length of a metal routing connected between output terminals of the first comparator and a third one of the comparators receiving one of the reference voltages having a level closest in magnitude to the minimum reference voltage,
   wherein the second comparator is adjacent both the first and third comparators.

2. The analog-to-digital conversion circuit of claim 1, wherein the first comparator and the second comparator are arranged adjacent to either end of the comparator array.

3. The analog-to-digital conversion circuit of claim 2, wherein the length of the metal routing connected between the output terminal of the first comparator and the output terminal of the second comparator is half the length of the metal routing connected between the output terminals of the first comparator and the third comparator.

4. The analog-to-digital conversion circuit of claim 1, wherein the analog-to-digital conversion circuit has one of a flash type structure, a pipeline type structure, a folding type structure, or an interpolation type structure.

5. The analog-to-digital conversion circuit of claim 1, wherein the plurality of reference voltages are different from one another.

6. The analog-to-digital conversion circuit of claim 1, further comprising an encoder to encode the logic signals output from the comparator array to generate digital data.

7. An analog-to-digital conversion circuit comprising:
   a reference voltage generation circuit for outputting a plurality of reference voltages;
   a comparator array comprising a plurality of comparators for comparing the plurality of reference voltages with analog data, respectively, and for outputting logic signals based on results of the comparisons, wherein comparators to which low reference voltages from among the plurality of reference voltages are input alternate with comparators to which high reference voltages from among the plurality of reference voltages are input; and
   an averaging circuit comprising at least one metal routing connected between output terminals of odd ordered comparators from among the plurality of comparators and at least one metal routing connected between output terminals of even ordered comparators from among the plurality of comparators,
   wherein the plurality of comparators compare the plurality of reference voltages with a positive analog voltage of a pair of differential analog data voltages of the analog data and a negative analog voltage of the pair, respectively, and the output logic signals include positive and negative logic signals.

8. The analog-to-digital conversion circuit of claim 7, wherein the high reference voltages are all higher than the low reference voltages.

9. The analog-to-digital conversion circuit of claim 7, wherein the reference voltages are different from one another.

10. The analog-to-digital conversion circuit of claim 7, further comprising an encoder to encode the logic signals output from the comparator array to generate digital data.

11. The analog-to-digital conversion circuit of claim 7, wherein:
    the averaging circuit further comprises a first metal routing connected between output terminals of a first pair of comparators arranged on one end of the comparator array and a second metal routing connected between output terminals of a second pair of comparators arranged on the other end of the comparator array,
    wherein a length of the first and second metal routings is less than a length of the at least one metal routing connected between the output terminals of the odd ordered comparators from among the plurality of comparators and a length of the at least one metal routing connected between the output terminals of the even ordered comparators from among the plurality of comparators.

12. The analog-to-digital conversion circuit of claim 11, wherein the length of the first and second metal routings is half a length of the at least one metal routing connected between the output terminals of the odd ordered comparators from among the plurality of comparators and a length of the at least one metal routing connected between the output terminals of the even ordered comparators from among the plurality of comparators.

13. The analog-to-digital conversion circuit of one of claim 7, wherein the analog-to-digital conversion circuit has one of a flash type structure, a pipeline type structure, a folding type structure, or an interpolation type structure.

14. An analog-to-digital conversion circuit comprising:
    a plurality of comparators receiving a respective one of a plurality of different reference voltages; and
    an averaging circuit configured so that a length of a metal routing connected between output terminals of two comparators arranged on a leftmost side from among the plurality of comparators or a length of a metal routing connected between output terminals of two comparators arranged on a rightmost side from among the plurality of comparators is less than a length of a metal routing connected between output terminals of two of the comparators to which reference voltages that are closest in magnitude are input, wherein each comparator has first-third input terminals and first-second output terminals, wherein each of the first input terminals receives a positive analog voltage, wherein each of the second input terminals receives a negative analog voltage, wherein adjacent pairs of the third input terminals respectively receive high and low reference voltages, the low reference voltages being different from one another, the high reference voltages being different from one another, and the low reference voltages being lower than the high voltages., wherein the first output terminals output a first differential voltage based on the input positive analog voltage and the input reference voltage, and wherein the second output terminals output a second differential voltage based on the input negative analog voltage and the input reference voltage.

15. The analog-to-digital conversion circuit of claim 14, wherein the analog-to-digital conversion circuit has one of a flash type structure, a pipeline type structure, a folding type structure, or an interpolation type structure.

16. The analog-to-digital conversion circuit of claim 14, further comprising a reference voltage generator configured to generate the high and low reference voltages.

17. The analog-to-digital conversion circuit of claim 14, wherein one of the two comparators receives the highest of the high reference voltages and the other of the two comparators receives the lowest of the low reference voltages.

* * * * *